(12) United States Patent
Okui et al.

(10) Patent No.: US 7,081,327 B2
(45) Date of Patent: Jul. 25, 2006

(54) CHEMICALLY AMPLIFIED POSITIVE PHOTORESIST COMPOSITION FOR THICK FILM, THICK-FILM PHOTORESIST LAMINATED PRODUCT, MANUFACTURING METHOD FOR THICK-FILM RESIST PATTERN, AND MANUFACTURING METHOD FOR CONNECTION TERMINAL

(75) Inventors: Toshiki Okui, Kawasaki (JP); Koichi Misumi, Kawasaki (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/025,870

(22) Filed: Dec. 29, 2004

(65) Prior Publication Data

US 2006/0141389 A1   Jun. 29, 2006

(51) Int. Cl.
G03C 1/73 (2006.01)
G03C 1/76 (2006.01)
G03F 7/039 (2006.01)
G03F 7/20 (2006.01)
G03F 7/30 (2006.01)
G03F 7/40 (2006.01)

(52) U.S. Cl. ............... 430/270.1; 430/910; 430/271.1; 430/326; 430/311; 430/313; 430/314; 430/315

(58) Field of Classification Search .................. None
See application file for complete search history.

(56) References Cited

U.S. PATENT DOCUMENTS 6,280,897 B1 * 8/2001 Asakawa et al. ........ 430/270.1

2005/0032373 A1 * 2/2005 Cameron et al. .......... 438/689

FOREIGN PATENT DOCUMENTS

| JP | 2001194788 | * 7/2001 |
|---|---|---|
| JP | 2001-281862 | 10/2001 |
| JP | 2001-281863 | 10/2001 |
| JP | 2002-258479 | 9/2002 |
| JP | 2004-309775 | 11/2004 |
| JP | 2004-309776 | 11/2004 |
| JP | 2004-309777 | 11/2004 |

OTHER PUBLICATIONS

DERWENT English abstract for JP 2001194788 (Sato et al).*
Machine Assisted English translation of JP 2001194788 (Sato et al), provided by JPO.*
U.S. Appl. No. 11/025,591, filed Dec. 29, 2004, Tokyo Ohka Kogyo Co., Ltd.
U.S. Appl. No. 11/025,589, filed Dec. 29, 2004, Tokyo Ohka Kogyo Co., Ltd.
U.S. Appl. No. 11/025,833, filed Dec. 29, 2004, Tokyo Ohka Kogyo Co., Ltd.

* cited by examiner

*Primary Examiner*—Sin Lee
(74) *Attorney, Agent, or Firm*—Knobbe Martens Olson & Bear LLP

(57) ABSTRACT

A chemically amplified positive photoresist composition for thick film that is used for forming a thick-film photoresist layer with a film thickness of 10 to 150 μm on top of a support, including (A) a compound that generates acid on irradiation with active light or radiation, and (B) a resin that displays increased alkali solubility under the action of acid, wherein the component (B) includes a resin formed from a copolymer containing a structural unit (b1) with a specific structure.

11 Claims, No Drawings

CHEMICALLY AMPLIFIED POSITIVE PHOTORESIST COMPOSITION FOR THICK FILM, THICK-FILM PHOTORESIST LAMINATED PRODUCT, MANUFACTURING METHOD FOR THICK-FILM RESIST PATTERN, AND MANUFACTURING METHOD FOR CONNECTION TERMINAL

BACKGROUND OF THE INVENTION

1. Field of the Invention

The present invention relates to a chemically amplified positive photoresist composition for thick film, a thick-film photoresist laminated product, a manufacturing method for a thick-film resist pattern, and a manufacturing method for a connection terminal. More specifically, the present invention relates to a chemically amplified positive photoresist composition for thick film, a thick-film photoresist laminated product, a manufacturing method for a thick-film resist pattern, and a manufacturing method for a connection terminal, which are ideal for use in the formation of connection terminals such as bumps or metal posts, and wiring patterns, during both the manufacture of circuit substrates, and the manufacture of electronic components such as CSP (chip size packages) that are mounted on such circuit substrates.

2. Description of Related Art

Photofabrication, which is now the most widely used technique for precision microprocessing, is a generic term describing the technology used for manufacturing precision components such as semiconductor packages by applying a photosensitive resin composition to the surface of a processing target to form a coating, patterning this coating using photolithography techniques, and then conducting chemical etching or electrolytic etching, and/or electroforming based mainly around electroplating, using the patterned coating as a mask.

Recently, reductions in the size of electronic equipment have lead to further developments in higher density packaging of semiconductor packages, including multipin thin-film packaging, reductions in package size, two dimensional packaging techniques using flip-chip systems, and other improvements in packaging density based on three dimensional packaging techniques. In these types of high density packaging techniques, connection terminals, including protruding electrodes (mounting terminals) such as bumps which protrude above the package, and metal posts that connect rewiring extending from peripheral terminals on the wafer with the mounting terminals, must be positioned on the surface of the substrate with very high precision.

The materials used in the above type of photofabrication are typically thick-film photoresists. Thick-film photoresists are used for forming thick-film photoresist layers, and can be used, for example, in the formation of bumps or metal posts by a plating process. Bumps or metal posts can be formed, for example, by forming a thick-film photoresist layer with a film thickness of approximately 20 μm on top of a support, exposing the photoresist layer through a predetermined mask pattern, developing the layer to form a resist pattern in which the portions for forming the bumps or metal posts have been selectively removed (stripped), embedding a conductor such as copper into the stripped portions (the resist-free portions) using plating, and then removing the surrounding residual resist pattern.

Positive photosensitive resin compositions including a compound containing a quinone diazide group have been disclosed as suitable thick-film photoresists for the formation of bumps or wiring (for example, see patent reference 1).

On the other hand, chemically amplified photoresists including an acid generator are known as photosensitive resin compositions with even better sensitivity than that provided by conventional positive photosensitive resin compositions including a compound containing a quinone diazide group. The characteristic features of a chemically amplified photoresist are that on irradiation (exposure), acid is generated from the acid generator, diffusion of this acid is promoted by post exposure baking, and the base resin or the like of the resin composition then undergoes an acid-catalyzed reaction, thereby altering the alkali solubility of the reacted resin.

Chemically amplified photoresists include positive photoresists, in which irradiation causes alkali insoluble portions to become alkali soluble, and negative photoresists, in which irradiation causes alkali soluble portions to become alkali insoluble.

Requirements for these types of thick-film photoresist compositions include an ability to form a film thickness of at least 10 μm, favorable adhesion to substrates, favorable resistance to the plating solution and favorable wetting characteristics in the plating solution during the plating treatment used for forming bumps, good conformation of the metal composition formed by the plating treatment to the resist pattern shape, and an ability to easily strip the photoresist using a stripping solution following the plating treatment. Furthermore, with advances in plating technology, multiple plating steps and plating steps that require more severe conditions have become necessary, meaning the photoresist also requires favorable resistance to the plating process itself, to enable it to withstand multiple plating steps.

Chemically amplified positive photoresist compositions for plating have already been disclosed as potential thick-film photoresist compositions (for example, see patent reference 2).

Furthermore, chemically amplified photoresist compositions for KrF excimer lasers with improved resolution and depth of focus, in which the change in alkali solubility on exposure (the contrast) has been increased in order to enable the production of a favorable resist pattern with a superior cross-sectional shape, have also been proposed (for example, see patent reference 3).

(Patent Reference 1)
Japanese Unexamined Patent Application, First Publication No. 2002-258479

(Patent Reference 2)
Japanese Unexamined Patent Application, First Publication No. 2001-281862

(Patent Reference 3)
Japanese Unexamined Patent Application, First Publication No. 2000-347405

However, when the conventional types of chemically amplified photoresist compositions disclosed in the patent references 2 and 3 are used to produce a thick-film resist layer, because the stress resistance of the photoresist composition to plating is unsatisfactory, the metal layer obtained from the plating treatment tends to swell, making it difficult to achieve a favorable pattern for the plated product. Furthermore, the resistance of the photoresist composition to the plating solution is also inadequate, with chips and cracks developing in the resist either during the plating step or during the washing step following plating, making conducting multiple plating steps with the same resist pattern essentially impossible (poor plating resistance).

Furthermore, with the photosensitive resin composition comprising a compound containing a naphthoquinone diazide group disclosed in the patent reference 1, which displays superior plating resistance, improving the sensitivity is problematic.

SUMMARY OF THE INVENTION

The present invention takes the above problems associated with the conventional technology into consideration, with an object of providing a chemically amplified positive photoresist composition for thick film, which enables the formation of a plated product with a favorable shape, displays excellent stress resistance, plating solution resistance, and plating resistance, offers high sensitivity, and is ideal for manufacturing connection terminals and the like, as well as providing a thick-film photoresist laminated product, a manufacturing method for a thick-film resist pattern that uses the laminated product, and a manufacturing method for a connection terminal.

As a result of intensive investigations, the inventors of the present invention discovered that in positive thick-film chemically amplified photoresist compositions, the object described above could be achieved by using a resin containing a structural unit with a specific structure as the resin that displays an increase in alkali solubility under the action of acid, and they were hence able to complete the present invention.

In other words, a first aspect of the present invention is a chemically amplified positive photoresist composition for thick film that is used for forming a thick-film photoresist layer with a film thickness of 10 to 150 μm on top of a support, including (A) a compound that generates acid on irradiation with active light or radiation, and (B) a resin that displays increased alkali solubility under the action of acid, wherein the component (B) includes a resin formed from a copolymer containing a structural unit (b1) represented by a general formula (1) shown below:

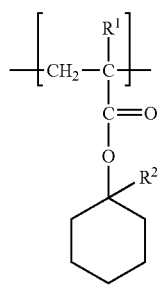

(wherein, $R^1$ represents a hydrogen atom or a methyl group, and $R^2$ represents a lower alkyl group).

The component (B) is preferably a resin comprising a copolymer containing the structural unit (b1), and a structural unit (b2) derived from a polymerizable compound containing an ether linkage.

In the above general formula (1), $R^2$ is preferably an alkyl group of 2 to 4 carbon atoms.

Relative to 100 parts by weight of the component (B), the quantity of the component (A) is preferably within a range from 0.1 to 10 parts by weight.

The chemically amplified positive photoresist composition for thick film of the first aspect may further include an alkali-soluble resin (C).

The alkali-soluble resin (C) preferably includes at least one resin selected from a group consisting of (c1) novolak resins, (c2) copolymers containing a hydroxystyrene structural unit and a styrene structural unit, (c3) acrylic resins, and (c4) vinyl resins.

A chemically amplified positive photoresist composition for thick film according to this first aspect may also include an acid diffusion control agent (D).

The polymerizable compound containing an ether linkage (b2) is preferably a compound represented by a general formula (7) shown below, or phenoxypolyethylene glycol (meth)acrylate, methoxypolypropylene glycol (meth)acrylate, or tetrahydrofurfuryl (meth)acrylate.

(wherein, R' represents a hydrogen atom or a methyl group, $R^{10}$ represents a hydrogen atom or an alkyl group of 1 or 2 carbon atoms, R" represents an alkyl group or aryl group of 1 to 7 carbon atoms that may also contain an oxygen atom, m represents an integer of either 1 or 2, and n represents an integer from 1 to 10.)

A second aspect of the present invention is a thick-film photoresist laminated product including a support, and a thick-film photoresist layer with a film thickness of 10 to 150 μm, formed from a chemically amplified positive photoresist composition for thick film according to the first aspect, laminated on top of the support.

The film thickness of this thick-film photoresist layer is preferably within a range from 20 to 120 μm.

A third aspect of the present invention is a manufacturing method for a thick-film resist pattern, including a lamination step for producing a thick-film photoresist laminated product according to the second aspect, an exposure step for selectively irradiating the thick-film photoresist laminated product with active light or radiation, and a developing step for conducting post exposure developing to produce a thick-film resist pattern.

A fourth aspect of the present invention is a manufacturing method for a connection terminal, including a step for forming a connection terminal formed from a conductor on a resist-free portion of a thick-film resist pattern produced using the manufacturing method for a thick-film resist pattern according to the third aspect.

The depth of the resist-free portion is preferably within a range from 10 to 150 μm, and even more preferably from 20 to 120 μm.

This resist-free portion describes the portion for forming bumps and metal posts that has been selectively removed (stripped) during developing of the exposed thick-film photoresist laminated product.

The term "structural unit" refers to a monomer unit used in producing a polymer. Furthermore, the term (meth)acrylic acid is a generic term for both methacrylic acid and acrylic acid.

Similarly, (meth)acrylate is a generic term for both acrylate and methacrylate.

The present invention provides a chemically amplified positive photoresist composition for thick film, which enables the formation of a plated product with a favorable shape, displays excellent plating resistance and a high level of contrast, and is ideal for manufacturing connection terminals and the like, as well as providing a thick-film photoresist laminated product, a manufacturing method for a thick-film resist pattern that uses the laminated product, and a manufacturing method for a connection terminal.

Using a chemically amplified positive photoresist composition for thick film of the first aspect of the present invention enables particularly favorable formation of resist patterns with aspect ratios of 2 or greater, and this enables the formation of resist-free patterns (resist-free portions) with aspect ratios of 2 or greater. Using a chemically amplified positive photoresist composition for thick film according to the first aspect of the present invention even enables the formation of resist patterns with an aspect ratio of 10, and resist-free patterns (resist-free portions) based on such resist patterns.

DETAILED DESCRIPTION OF THE INVENTION

As follows is a detailed description of the present invention.

A chemically amplified positive photoresist composition for thick film according to the present invention is a composition used for forming a thick-film photoresist layer with a film thickness of 10 to 150 μm on top of a support, and includes (A) a compound that generates acid on irradiation with active light or radiation, and (B) a resin that displays increased alkali solubility under the action of acid, wherein the component (B) includes (b1) a resin formed from a copolymer containing a structural unit represented by a general formula (1) shown above.

First is a description of the compound (A) that generates acid on irradiation with active light or radiation.

The compound (A) that generates acid on irradiation with active light or radiation in the present invention (hereafter referred to as the component (A)) is an acid generator, and there are no particular restrictions on the compound, provided it generates acid, either directly or indirectly, on irradiation.

Specific examples include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine, and tris(2,3-dibromopropyl)-1,3,5-triazine, and tris(2,3-dibromopropyl) isocyanurate represented by a general formula (2) shown below such as halogen-containing triazine compounds.

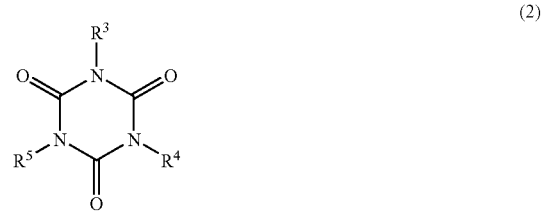

(wherein, $R^3$ to $R^5$ may be either the same or different, and each represents a halogenated alkyl group)

Other specific examples of the component (A) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile, α-(ethylsulfonyloxyimino)-1-cyclopentenylacetonitrile, and compounds represented by a general formula (3) shown below.

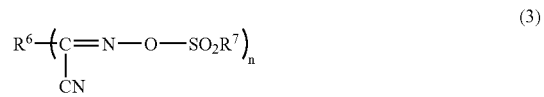

(wherein, $R^6$ represents a monovalent to trivalent organic group, $R^7$ represents a substituted or unsubstituted saturated hydrocarbon group, unsaturated hydrocarbon group, or aromatic compound group, and n represents a natural number within a range from 1 to 3.)

Here, the term "aromatic compound group" refers to a group formed from a compound that shows the characteristic physical and chemical properties of an aromatic compound, and specific examples include aromatic hydrocarbon groups such as a phenyl group or naphthyl group, and heterocyclic groups such as a furyl group or thienyl group. These groups may also include suitable substituents on the ring, including one or more halogen atoms, alkyl groups, alkoxy groups, or nitro groups. Compounds in which $R^6$ represents an aromatic compound group, and $R^7$ represents a lower alkyl group are particularly preferred. Furthermore, as the group $R^7$, alkyl groups of 1 to 4 carbon atoms are particularly preferred, including a methyl group, ethyl group, propyl group, and butyl group. Examples of the acid generators represented by the above general formula, in the case where n=1, include compounds in which $R^6$ is a phenyl group, a methylphenyl group or a methoxyphenyl group, and $R^7$ is a methyl group, namely, α-(methylsulfonyloxyimino)-1-phenylacetonitrile, α-(methylsulfonyloxyimino)-1-(p-methylphenyl)acetonitrile, and α-(methylsulfonyloxyimino)-1-(p-methoxyphenyl)acetonitrile. In the case where n=2, specific examples of the acid generators represented by the above general formula include the acid generators represented by the chemical formulas shown below.

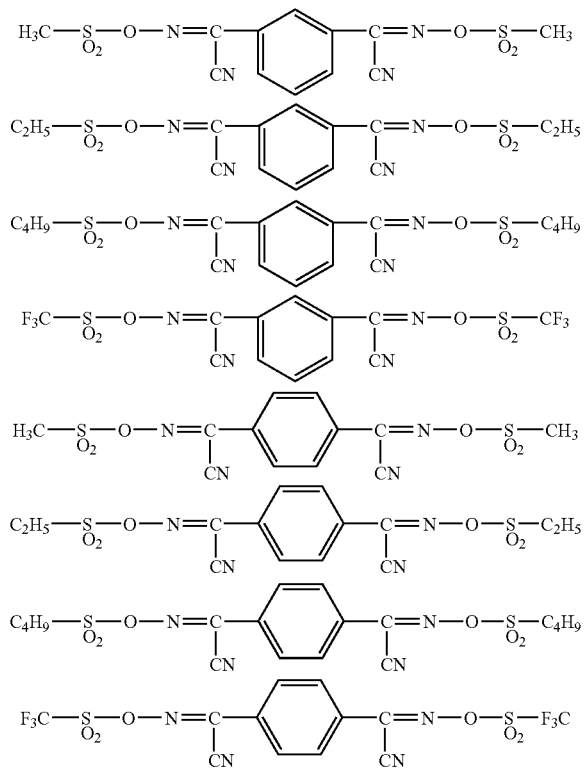

Additional specific examples of the component (A) include bissulfonyldiazomethanes such as bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane; nitrobenzyl derivatives such as 2-nitrobenzyl p-toluenesulfonate, 2,6-nitrobenzyl p-toluenesulfonate, nitrobenzyl tosylate, dinitrobenzyl tosylate, nitrobenzyl sulfonate, nitrobenzyl carbonate, and dinitrobenzyl carbonate; sulfonic acid esters such as pyrogallol trimesylate, pyrogallol tritosylate, benzyl tosylate, benzyl sulfonate, N-methylsulfonyloxysuccinimide, N-trichloromethylsulfonyloxysuccinimide, N-phenylsulfonyloxymaleimide, and N-methylsulfonyloxyphthalimide; trifluoromethanesulfonic acid esters of N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate, and (p-tert-butylphenyl)diphenylsulfonium trifluoromethanesulfonate; benzoin tosylates such as benzoin tosylate and α-methylbenzoin tosylate; and other diphenyliodonium salts, triphenylsulfonium salts, phenyldiazonium salts, and benzyl carbonate.

Of these compounds, preferred compounds for the component (A) include compounds containing at least two oxime sulfonate groups represented by a general formula (4) shown below:

(wherein, R represents a substituted or unsubstituted alkyl group or aryl group of, for example, 1 to 8 carbon atoms), and of these, compounds represented by a general formula (5) shown below are particularly preferred.

(wherein, A represents a bivalent, substituted or unsubstituted alkylene group of 1 to 8 carbon atoms, or a bivalent aromatic compound group, and R represents a substituted or unsubstituted alkyl group or aryl group of, for example, 1 to 8 carbon atoms). Here, the term "aromatic compound group" refers to a group formed from a compound that shows the characteristic physical and chemical properties of an aromatic compound, and specific examples include aromatic hydrocarbon groups such as a phenyl group or naphthyl group, and heterocyclic groups such as a furyl group or thienyl group. These groups may also include suitable substituents on the ring, including one or more halogen atoms, alkyl groups, alkoxy groups, or nitro groups. Compounds of the above general formula in which A represents a phenylene group and R represents, for example, a lower alkyl group of 1 to 4 carbon atoms are particularly desirable.

This component (A) can use either a single compound, or a combination of two or more different compounds.

The blend quantity of the component (A) is typically within a range from 0.1 to 10 parts by weight, and preferably from 0.2 to 5 parts by weight, per 100 parts by weight of the component (B). By ensuring this quantity is at least 0.1 parts by weight, satisfactory sensitivity can be achieved, and by ensuring the quantity is no more than 10 parts by weight, a favorable solubility is achieved in the solvent, enabling the formation of a homogeneous solution, which tends to improve the storage stability.

Next is a description of the aforementioned resin (B) that displays increased alkali solubility under the action of acid.

The resin (B) that displays increased alkali solubility under the action of acid (hereafter referred to as the component (B)), used in a chemically amplified positive photoresist composition according to the present invention, is a resin formed from a copolymer containing a structural unit (b1) (hereafter referred to as a unit (b1)) represented by a general formula (1) shown below:

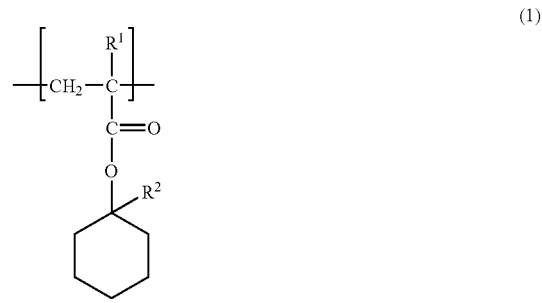

(wherein, $R^1$ represents a hydrogen atom or a methyl group, and $R^2$ represents a lower alkyl group).

As follows is a description of the unit (b1).

The unit (b1) is a structural unit represented by the general formula (1) shown above.

In the general formula (1), $R^1$ represents either a hydrogen atom or a methyl group.

The lower alkyl group represented by $R^2$ may be either a straight chain group or a branched group, and suitable examples include a methyl group, ethyl group, n-propyl group, isopropyl group, n-butyl group, isobutyl group, secbutyl group, tert-butyl group, and any of the various pentyl groups. Of these, from the viewpoints of achieving a high level of contrast, and favorable resolution and depth of focus values and the like, a lower alkyl group of 2 to 4 carbon atoms is particularly desirable.

Specific examples of preferred forms of the structural unit represented by the above general formula (1) include the structural units shown below.

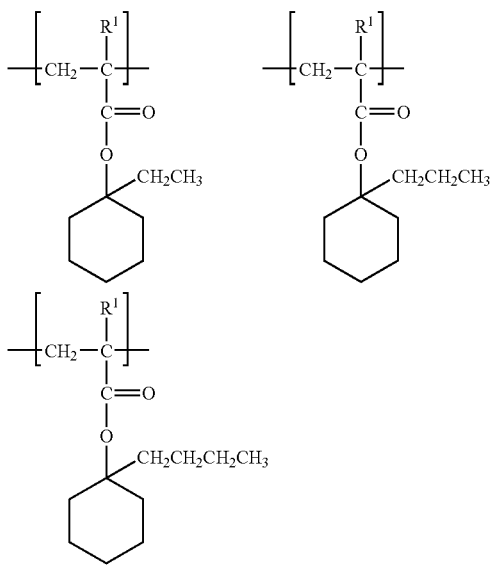

As the unit (b1), either a single structural unit represented by the general formula (1) can be used, or alternatively, two or more structural units with different structures can be used.

In addition, the component (B) is preferably a resin comprising a copolymer containing the above structural unit (b1), and a structural unit (b2) derived from a polymerizable compound containing an ether linkage. By incorporating the component (b2), the adhesion with the substrate during developing can be improved, and a more favorable plating solution resistance is achieved.

As follows is a description of the unit (b2).

The unit (b2) is a structural unit derived from a polymerizable compound containing an ether linkage.

Examples of this polymerizable compound containing an ether linkage include compounds represented by a general formula (7) shown below, as well as phenoxypolyethylene glycol (meth)acrylate, methoxypolypropylene glycol (meth) acrylate, and tetrahydrofurfuryl (meth)acrylate.

$$CH_2=C(R')COO-(C_mH_{2m}-CHR^{10}-O)_n-R''\qquad(7)$$

(wherein, R' represents a hydrogen atom or a methyl group, $R^{10}$ represents a hydrogen atom or an alkyl group of 1 or 2 carbon atoms, R" represents an alkyl group or aryl group of 1 to 7 carbon atoms that may also contain an oxygen atom, m represents an integer of either 1 or 2, and n represents an integer from 1 to 10.)

Specific examples of the polymerizable compound containing an ether linkage include radical polymerizable compounds, including (meth)acrylic acid derivatives containing both an ether linkage and an ester linkage such as 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, and tetrahydrofurfuryl (meth)acrylate. Of these, 2-methoxyethyl (meth)acrylate, 2-ethoxyethyl (meth)acrylate, and methoxytriethylene glycol (meth)acrylate are preferred. These compounds can be used either singularly, or in combinations of two or more different compounds.

In addition, for the purposes of controlling certain physical and chemical properties, the component (B) may also contain structural units derived from other polymerizable compounds. Here, the term "other polymerizable compound" means polymerizable compounds other than the monomers that give rise to the aforementioned structural unit (b1) and structural unit (b2). Such polymerizable compounds include known radical polymerizable compounds and anionic polymerizable compounds. Specific examples include radical polymerizable compounds, including monocarboxylic acids such as acrylic acid, methacrylic acid, and crotonic acid, dicarboxylic acids such as maleic acid, fumaric acid, and itaconic acid, methacrylic acid derivatives containing both a carboxyl group and an ester linkage such as 2-methacryloyloxyethylsuccinic acid, 2-methacryloyloxyethylmaleic acid, 2-methacryloyloxyethylphthalic acid, and 2-methacryloyloxyethylhexahydrophthalic acid; alkyl (meth)acrylates such as methyl (meth)acrylate, ethyl (meth)acrylate, and butyl (meth)acrylate; hydroxyalkyl (meth)acrylates such as 2-hydroxyethyl (meth)acrylate and 2-hydroxypropyl (meth)acrylate; aryl (meth)acrylates such as phenyl (meth)acrylate and benzyl (meth)acrylate; diesters of dicarboxylic acids such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

The quantity of the unit (b1) within the component (B) is preferably within a range from 10 to 90% by weight, and even more preferably from 20 to 80% by weight. If this quantity exceeds 90% by weight, then the sensitivity tends to fall, whereas if the quantity is less than 10% by weight, then the residual film ratio tends to decrease.

The quantity of the unit (b2) within the component (B) is preferably within a range from 10 to 90% by weight, and even more preferably from 20 to 80% by weight. If this quantity exceeds 90% by weight, then the residual film ratio tends to decrease, whereas if the quantity is less than 10% by weight, then the adhesion with the substrate during developing, and the plating solution resistance tend to deteriorate.

Furthermore, the polystyrene equivalent weight average molecular weight (hereafter referred to as the weight average molecular weight) of the component (B) is preferably no more than 500,000, and even more preferably 400,000 or less. If the weight average molecular weight exceeds 500,000, then the strippability deteriorates. Furthermore, the weight average molecular weight of the component (B) is preferably at least 10,000, and preferably 30,000 or greater. If the weight average molecular weight is less than 10,000, then the resist film does not attain sufficient strength, increasing the danger of blistering or cracking of the resist profile during plating.

As a result of containing the unit (b1), the component (B) displays a large change in alkali solubility on exposure (a high level of contrast).

Next is a description of the alkali-soluble resin (C).

A chemically amplified positive photoresist composition for thick film of the present invention preferably also comprises an alkali-soluble resin (C) (hereafter referred to as the component (C)), in order to enable certain physical and chemical properties to be controlled. As this component (C), resins selected from amongst known resins commonly used as alkali-soluble resins in conventional chemically amplified photoresists can be used. Of such resins, those containing at least one resin selected from a group consisting of (c1) novolak resins, (c2) copolymers containing a hydroxystyrene structural unit and a styrene structural unit, (c3) acrylic resins, and (c4) vinyl resins are preferred, and resins comprising a novolak resin (c1) and/or a copolymer (c2) containing a hydroxystyrene structural unit and a styrene structural unit are particularly preferred. The reason for this preference is that such resins facilitate better control of the coatability and the developing rate.

First is a description of the novolak resin (c1).

The novolak resin of the component (c1) is typically obtained by an addition condensation of an aromatic compound with a phenolic hydroxyl group (hereafter, simply referred to as a phenol) and an aldehyde, in the presence of an acid catalyst.

Examples of the phenol used include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, fluoroglucinol, hydroxydiphenyl, bisphenol A, gallic acid, gallic esters, α-naphthol, and β-naphthol.

Furthermore, examples of the aldehyde include formaldehyde, furfural, benzaldehyde, nitrobenzaldehyde, and acetaldehyde.

There are no particular restrictions on the catalyst used in the addition condensation, and suitable acid catalysts include hydrochloric acid, nitric acid, sulfuric acid, formic acid, oxalic acid, and acetic acid.

Novolak resins that use solely m-cresol as the phenol display particularly favorable developing profiles, and are consequently preferred.

Next is a description of the above copolymer (c2) containing a hydroxystyrene structural unit and a styrene structural unit.

The component (c2) used in the present invention is a copolymer that contains at least a hydroxystyrene structural unit and a styrene structural unit. This includes copolymers comprising only hydroxystyrene structural units and styrene structural units, as well as copolymers comprising hydroxystyrene structural units, styrene structural units, and other, different structural units.

Examples of the hydroxystyrene structural unit include hydroxystyrene structural units derived from hydroxystyrenes such as p-hydroxystyrene, or from α-alkylhydroxystyrenes such as α-methylhydroxystyrene and α-ethylhydroxystyrene.

Examples of the styrene structural unit include structural units derived from styrene, chlorostyrene, chloromethylstyrene, vinyltoluene, and α-methylstyrene.

Next is a description of the acrylic resin (c3).

There are no particular restrictions on the acrylic resin of the component (c3), provided it is an alkali-soluble acrylic resin, although acrylic resins comprising a structural unit derived from a polymerizable compound containing an ether linkage, and a structural unit derived from a polymerizable compound containing a carboxyl group are particularly preferred.

Examples of polymerizable compounds containing an ether linkage include (meth)acrylic acid derivatives containing both an ether linkage and an ester linkage such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, and tetrahydrofurfuryl (meth)acrylate, and of these, 2-methoxyethyl (meth)acrylate and methoxytriethylene glycol (meth)acrylate are preferred. These compounds can be used either singularly, or in combinations of two or more different compounds.

Examples of polymerizable compounds containing a carboxyl group include monocarboxylic acids such as acrylic acid, methacrylic acid, and crotonic acid, dicarboxylic acids such as maleic acid, fumaric acid, and itaconic acid, and compounds containing both a carboxyl group and an ester linkage such as 2-methacryloyloxyethylsuccinic acid, 2-methacryloyloxyethylmaleic acid, 2-methacryloyloxyethylphthalic acid, and 2-methacryloyloxyethylhexahydrophthalic acid. Of these, acrylic acid and methacrylic acid are preferred. These compounds can be used either singularly, or in combinations of two or more different compounds.

Next is a description of the vinyl resin (c4).

The vinyl resin of the component (c4) is a poly(vinyl low alkyl ether), and comprises a (co)polymer produced by polymerizing either a single vinyl low alkyl ether represented by a general formula (6) shown below, or a mixture of two or more such ethers.

(wherein in the general formula (6), $R^8$ represents a straight chain or branched alkyl group of 1 to 5 carbon atoms.)

In the general formula (6), examples of the straight chain or branched alkyl group of 1 to 5 carbon atoms include a methyl group, ethyl group, n-propyl group, i-propyl group, n-butyl group, i-butyl group, n-pentyl group, and i-pentyl group. Of these alkyl groups, a methyl group, ethyl group, or i-butyl group is preferred, and a methyl group is particularly desirable. In the present invention, poly (vinyl methyl ether) is a particularly preferred poly(vinyl low alkyl ether).

The blend quantity of the component (C) is typically within a range from 0 to 300 parts by weight, and preferably from 0 to 200 parts by weight, per 100 parts by weight of the component (B). If this blend quantity exceeds 300 parts by weight, then the contrast between the exposed portions and the unexposed portions, which is required for forming a pattern, tends to diminish, increasing the likelihood of undesirable thickness loss.

As follows is a description of the acid diffusion control agent (D).

In a chemically amplified positive photoresist composition for thick film according to the present invention, an acid diffusion control agent (D) (hereafter referred to as the component (D)) is preferably added to improve the resist pattern shape, and the post exposure stability of the latent image formed by the pattern-wise exposure of the resist layer.

As the component (D), any of the known compounds typically used as acid diffusion control agents in conventional chemically amplified resists can be selected and used. Incorporating a nitrogen-containing compound (d1) within the component (D) is particularly preferred, and where necessary, (d2) an organic carboxylic acid, a phosphorus oxo acid compound, or a derivative thereof can also be included.

Next is a description of the above nitrogen-containing compound (d1).

Examples of the nitrogen-containing compound of the component (d1) include trimethylamine, diethylamine, triethylamine, di-n-propylamine, tri-n-propylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1, 3,3-tetramethylurea, 1,3-diphenylurea, imidazole, benzimidazole, 4-methylimidazole, 8-oxyquinoline, acridine, purine, pyrrolidine, piperidine, 2,4,6-tri(2-pyridyl)-s-triazine, morpholine, 4-methylmorpholine, piperazine, 1,4-dimethylpiperazine, and 1,4-diazabicyclo[2.2.2]octane.

Of these, alkanolamines such as triethanolamine are particularly preferred.

These compounds can be used either singularly, or in combinations of two or more different compounds.

The component (d1) is typically used in quantities within a range from 0 to 5% by weight, and preferably from 0 to 3% by weight, relative to a value of 100% by weight for the component (B).

Next is a description of the above organic carboxylic acid, phosphorus oxo acid compound, or derivative thereof (d2).

As the organic carboxylic acid, acids such as malonic acid, citric acid, malic acid, succinic acid, benzoic acid, and salicylic acid are ideal, and salicylic acid is particularly desirable.

Examples of the phosphorus oxo acid compound or derivative thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid. Of these, phosphonic acid is particularly desirable.

These compounds can be used either singularly, or in combinations of two or more different compounds.

The component (d2) is typically used in quantities within a range from 0 to 5% by weight, and preferably from 0 to 3% by weight, relative to a value of 100% by weight for the component (B).

Furthermore, the component (d2) is preferably used in the same quantity as the component (d1). The reason for this requirement is that the component (d2) and the component (d1) are stabilized through the formation of a mutual salt.

Other conventional miscible additives can also be added to a chemically amplified positive photoresist composition for thick film of the present invention according to need, provided such addition does not impair the intrinsic characteristics of the present invention, and examples of such miscible additives include additive resins for improving the properties of the resist film, plasticizers, adhesion assistants, stabilizers, colorants, and surfactants.

In addition, a chemically amplified positive photoresist composition for thick film of the present invention may also include a suitable quantity of an organic solvent for the purposes of regulating the composition viscosity. Specific examples of this organic solvent include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used singularly, or as a mixed solvent of two or more different solvents.

The quantity used of such solvents, for example in the case in which spin coating is used to form a thick film of at least 10 µm, is preferably sufficient to produce a solid fraction concentration for the chemically amplified positive photoresist composition for thick film that falls within a range from 30 to 65% by weight. If this solid fraction concentration is less than 30% by weight, then producing a film thickness that is ideal for the manufacture of a connection terminal becomes problematic, whereas if the solid fraction concentration exceeds 65% by weight, then the fluidity of the composition worsens markedly, making handling difficult, and also making it difficult to achieve a uniform resist film using spin coating methods.

Preparation of a chemically amplified positive photoresist composition for thick film according to the present invention may be conducted by simply mixing and stirring together each of the components described above using normal methods, or if necessary, by dispersing and mixing the components using a dispersion device such as a dissolver, a homogenizer, or a three roll mill. Furthermore, following mixing of the components, the composition may also be filtered using a mesh or a membrane filter or the like.

A chemically amplified positive photoresist composition for thick film of the present invention is ideal for forming a thick-film photoresist layer with a film thickness of 10 to 150 µm, and preferably from 20 to 120 µm, and even more preferably from 20 to 80 µm, on the surface of a support.

A thick-film photoresist laminated product of the present invention includes a support, and a thick-film photoresist layer, formed from an aforementioned chemically amplified positive photoresist composition for thick film, laminated on top of the support.

As the support used in the present invention, conventional supports can be used without any particular restrictions, and suitable examples include substrates for electronic componentry, as well as substrates on which a predetermined wiring pattern has already been formed. Specific examples of suitable substrates include metal-based substrates such as silicon, silicon nitride, titanium, tantalum, palladium, titanium-tungsten, copper, chrome, iron, and aluminum, as well as glass substrates. Suitable materials for the wiring pattern include copper, solder, chrome, aluminum, nickel, and gold.

The thick-film photoresist laminated product described above can be manufactured using the method described below for example.

Namely, a solution of a chemically amplified photoresist composition for thick film prepared in the manner described above is applied to a support, and heating is used to remove the solvent and form the desired coating. The application of the solution to the support can be conducted using a method such as spin coating, slit coating, roll coating, screen printing, or an applicator-based method. The prebake conditions used for a coating of a composition of the present invention vary depending on factors such as the nature of each of the components within the composition, the blend proportions used, and the thickness with which the composition is applied, although typical conditions involve heating at 70 to 150° C., and preferably at 80 to 140° C., for a period of 2 to 60 minutes.

Subsequently, in order to form a resist pattern using the thus produced thick-film photoresist laminated product, the thick-film photoresist layer is selectively irradiated (exposed), through a mask with a predetermined pattern, with active light or radiation, such as ultraviolet light of wavelength 300 to 500 nm or visible light.

In this description, "active light" describes light rays that activate the acid generator, thus causing the generation of acid. As the light source for the active light or radiation, a low pressure mercury lamp, high pressure mercury lamp, ultra high pressure mercury lamp, metal halide lamp, or argon gas laser or the like can be used. In this description, the term "radiation" refers to ultraviolet radiation, visible light, far ultraviolet radiation, X-rays, electron beams, and ion beams and the like. The radiation exposure dose varies depending on the nature of each of the components within the composition, the blend proportions used, and the thickness of the coating, although in those cases where a ultra high pressure mercury lamp is used, a typical exposure dose is within a range from 100 to 10,000 mJ/cm$^2$.

Subsequently, following exposure, the laminated product is heated using conventional methods, to promote diffusion of the acid and alter the alkali solubility of the exposed portions of the thick-film photoresist layer.

Using a predetermined aqueous alkali solution as the developing solution, the unnecessary portions of the resist layer are then dissolved and removed, thus yielding a predetermined resist pattern. Suitable examples of the developing solution include aqueous solutions of alkali materials such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5,4,0]-7-undecene, and 1,5-diazabicyclo[4,3,0]-5-nonane. An aqueous solution prepared by adding a water-soluble organic solvent such as methanol or ethanol, or a surfactant to the aqueous solution of any of these alkali compounds may also be used as the developing solution.

The developing time varies depending on the nature of each of the components within the composition, the blend proportions used, and the dried film thickness of the composition, but is typically within a range from 1 to 30 minutes. Furthermore, suitable methods for the developing process include spin methods, dipping methods, puddle methods, and spray developing methods. Following developing, the structure is washed under running water for 30 to 90 seconds, and is then dried using an air gun or an oven or the like.

Connection terminals such as metal posts and bumps can then be formed by using plating or the like to embed a conductor formed from a metal or the like within the resist-free portions (the portions removed by the alkali developing solution) of the thus obtained resist pattern. There are no particular restrictions on the plating method, and any conventional plating method can be used. As the plating solution, a solder plating solution, copper plating solution, gold plating solution, or nickel plating solution can be favorably used.

Finally, the remaining resist pattern is removed in accordance with conventional methods, using a stripping solution or the like.

EXAMPLES

As follows is a description of examples of the present invention, although these examples in no way limit the scope of the invention.

Synthesis Example 1

<Synthesis of (B-1) Through (B-5): Resins that Display Increased Alkali Solubility Under the Action of Acid>

A flask equipped with a stirrer, a reflux condenser, a thermometer, and a dropping funnel was flushed with nitrogen, and subsequently charged with propylene glycol methyl ether acetate as a solvent, and stirring of the solvent was then initiated. The temperature of the solvent was then raised to 80° C. The dropping funnel was charged with 2,2'-azobisisobutyronitrile as a polymerization catalyst, 50% by weight of 1-ethylcyclohexyl methacrylate as the unit (b1), and 50% by weight of 2-ethoxyethyl acrylate as the structural unit (b2), and following stirring to dissolve the polymerization catalyst, the resulting solution was added dropwise to the flask at a uniform rate over 3 hours. Reaction was then continued for a further 5 hours at 80° C. to allow the polymerization to proceed. The temperature was then cooled to room temperature, yielding a resin of the component (B).

This resin was then fractionated, yielding 5 resins (B-1) to (B-5) with the different weight average molecular weights shown below.

(B-1): weight average molecular weight 50,000

(B-2): weight average molecular-weight 150,000

(B-3): weight average molecular weight 250,000

(B-4): weight average molecular weight 350,000

(B-5): weight average molecular weight 500,000

Synthesis Example 2

<Synthesis of (B-6): a Resin that Displays Increased Alkali Solubility Under the Action of Acid>

With the exceptions of using 20% by weight of 1-ethylcyclohexyl methacrylate as the structural unit (b1), and 80% by weight of 2-ethoxyethyl acrylate as the structural unit (b2), reaction was conducted in the same manner as the synthesis example 1, yielding a resin (B-6) with a weight average molecular weight of 350,000.

Synthesis Example 3

<Synthesis of (B-7): a Resin that Displays Increased Alkali Solubility Under the Action of Acid>

With the exceptions of using 80% by weight of 1-ethylcyclohexyl methacrylate as the structural unit (b1), and 20% by weight of 2-ethoxyethyl acrylate as the structural unit (b2), reaction was conducted in the same manner as the synthesis example 1, yielding a resin (B-7) with a weight average molecular weight of 350,000.

Synthesis Example 4

<Synthesis of a Novolak Resin (c1)> m-cresol and p-cresol were mixed together in a weight ratio of 60:40, formalin was added to the mixture, and a condensation was then conducted under conventional conditions using oxalic acid as a catalyst, thus yielding a cresol novolak resin. This resin was subjected to fractionation to remove the low molecular weight fraction, yielding a novolak resin with a weight average molecular weight of 15,000. This resin was labeled (C-1).

Synthesis Example 5

<Synthesis of a Copolymer (c2) Containing a Hydroxystyrene Structural Unit and a Styrene Structural Unit>

With the exception of using 75% by weight of hydroxystyrene units and 25% by weight of styrene units as the structural units, reaction was conducted in the same manner as the synthesis example 1, yielding a resin (C-2) with a weight average molecular weight of 3,000.

Synthesis Example 6

<Synthesis of an Acrylic Resin (c3)>

With the exception of using 130 parts by weight of 2-methoxyethyl acrylate, 50 parts by weight of benzyl methacrylate, and 20 parts by weight of acrylic acid as structural units, reaction was conducted in the same manner as the synthesis example 1, yielding a resin (C-3) with a weight average molecular weight of 250,000.

Synthesis Example 7

<Synthesis of a Vinyl Resin (c4)>

A methanol solution of poly(vinyl methyl ether) (weight average molecular weight 50,000) (manufactured by Tokyo Kasei Kogyo Co., Ltd., concentration: 50% by weight) was subjected to a solvent exchange to propylene glycol monomethyl ether acetate using a rotary evaporator, thus yielding a resin (C-4) as a solution with a concentration of 50% by weight.

Examples 1 to 13

<Preparation of Chemically Amplified Positive Photoresist Compositions for Thick Film>

The various components shown in Table 1 were mixed together in propylene glycol monomethyl ether acetate to form a series of homogeneous solutions, and each solution was then filtered through a membrane filter with a pore size of 1 μm, thus yielding a chemically amplified positive photoresist composition for thick film.

As the acid generator of the component (A), the following two compounds were used.

(A-1): (5-propylsulfonyloxyimino-5H-thiophen-2-ylidene)-(2-methylphenyl)acetonitrile (A-2): the compound represented by the chemical formula (11) shown below.

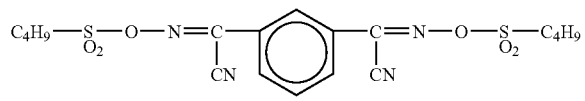

(II)

Furthermore, in Table 1, (D-1) represents salicylic acid, and (D-2) represents triethanolamine. The numerical values in Table 1 represent the number of parts by weight of each component.

TABLE 1

| | Example | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| A-1 | | | | | | | 2.5 | 2 | | 1.5 | 1 | 0.5 | |
| A-2 | 1 | 1 | 1 | 1 | 1 | 1 | | | | | | 1 | 1 |
| B-1 | | | | | | | 60 | | | | | | |
| B-2 | | | | | | | | 55 | | | | | |
| B-3 | | | | | | | | | 50 | | | | |
| B-4 | 100 | 50 | 50 | 50 | 50 | 50 | | | | 45 | | | |
| B-5 | | | | | | | | | | | 40 | | |
| B-6 | | | | | | | | | | | | 50 | |
| B-7 | | | | | | | | | | | | | 50 |
| C-1 | | 50 | | | | | 20 | 40 | 45 | 50 | 55 | 60 | 50 | 50 |
| C-2 | | | 50 | | | | 20 | | | | | | |
| C-3 | | | | 50 | | | 5 | | | | | | |
| C-4 | | | | | 50 | 5 | | | | | | | |
| D-1 | | | | | | | 0.3 | | 0.2 | 0.2 | 0.1 | 0.1 | |
| D-2 | | | | | | | 0.3 | | 0.2 | 0.2 | 0.1 | 0.1 | |

Comparative Example 1

<Preparation of Chemically Amplified Positive Photoresist Compositions for Thick Film>

3 parts by weight of an acid generator (A) (the compound represented by the above chemical formula (11)); 100 parts by weight of a component (B) (comprising 67 parts by weight of a copolymer with a weight average molecular weight of 8,000, containing 67 mol % of hydroxystyrene units, 22 mol % of styrene units, and 11 mol % of 1-ethylcyclohexyl methacrylate units, and 33 parts by weight of a copolymer containing 67 mol % of hydroxystyrene units, 29 mol % of styrene units, and 4 mol % of 1-ethylcyclohexyl methacrylate units); 0.1 parts by weight of triethanolamine as a component (d1); and 0.1 parts by weight of phenylphosphonic acid as a component (d2) were prepared, these components were dissolved in 300 parts by weight of ethyl lactate, a fluorine-based surfactant [brand name: Fluorad FC-171 (manufactured by 3M Corporation)] was added in a quantity equivalent to 1.0% by weight relative to the total weight of the solution, and the solution was then filtered through a membrane filter with a pore size of 0.2 μm, thus yielding a positive resist composition.

Test Example 1

The characteristics of the chemically amplified positive photoresist compositions produced in the examples described above were evaluated in the following manner.

Compatibility

Each composition was stirred for 12 hours at room temperature, and the state of the solution immediately following completion of the stirring, and the state of the solution upon leaving the solution to stand for a further 12 hours were observed visually. The state of the dispersion was evaluated using the following criteria.

A: The composition was visually confirmed as being uniformly dispersed following stirring for 12 hours, and remained uniformly dispersed after standing for 12 hours.

B: The composition was uniformly dispersed following stirring for 12 hours, but underwent phase separation on standing for 12 hours.

C: The composition was not uniformly dispersed even after stirring for 12 hours.

Coatability

Each composition was applied to a 5-inch gold sputtered wafer (a gold substrate) over a period of 25 seconds, using a spinner operating at 1000 rpm, and the applied composition was then heated on a hotplate at 110° C. for 6 minutes. The thus formed coating was inspected visually, and the coatability was evaluated using the following criteria.

A: The formed coating was uniform with no unevenness.

B: The formed coating was not uniform, and displayed poor planarity.

C: The formed coating displayed irregularities such as pinholes and cissing.

Developability, Resolution

Thick-film photoresist laminated products with coating films of thickness 20 μm, 65 μm, and 120 μm were formed.

In the case of the coating films with a thickness of approximately 20 μm, each composition was applied to a 5-inch gold sputtered wafer over a period of 25 seconds, using a spinner operating at 1800 rpm, so as to form a film thickness of approximately 20 μm, and was then prebaked on a hotplate at 110° C. for 6 minutes, thus forming a thick-film photoresist laminated product.

In the case of the coating films with a thickness of approximately 65 μm, each composition was applied over a period of 25 seconds at 800 rpm, and prebaked on a hotplate at 110° C. for 1 minute, before an additional application for 25 seconds at 800 rpm and subsequent prebaking at 110° C. for 12 minutes, thus forming a thick-film photoresist laminated product.

Furthermore, in the case of the coating films with a thickness of approximately 120 μm, each composition was first applied over a period of 25 seconds at 800 rpm and prebaked on a hotplate at 110° C. for 1 minute, then once again applied for 25 seconds at 500 rpm and prebaked on a hotplate at 110° C. for 1 minute, before a final application for 25 seconds at 500 rpm and subsequent prebaking at 110° C. for 20 minutes, thus forming a thick-film photoresist laminated product.

Each of the thus formed thick-film photoresist laminated products was exposed with ultraviolet radiation through a pattern mask used for measuring resolution, at exposure doses ranging in a stepwise manner from 100 to 10,000 mJ/cm$^2$, using a stepper device (NSR-2005i10D, manufactured by Nikon Corporation). Following exposure, the product was heated at 70° C. for 5 minutes, and was then developed in a developing solution (brand name: P-7G from the PMER series, manufactured by Tokyo Ohka Kogyo Co., Ltd.).

The developed product was washed under running water, and blown with nitrogen to yield a pattern-wise cured product. This cured product was inspected under a microscope, and the developability and resolution were evaluated using the following criteria.

A: A pattern with an aspect ratio of 2 or greater was generated at one of the above exposure doses, and no residues were visible.

C: Either a pattern with an aspect ratio of 2 or greater was not generated, or residues were visible.

The aspect ratio represents the value of (the height of the patterned resist divided by the width of the patterned resist).

Plating Solution Resistance

The substrates comprising the pattern-wise cured product prepared for the evaluation of developability and resolution were used as test specimens. Each test specimen was subjected to ashing treatment using an oxygen plasma, was subsequently immersed in a gold sulfite plating solution at 65° C. for 40 minutes, and was then washed under running water, yielding a treated test specimen. The state of the bumps and the pattern-wise cured product formed on the surface of the treated test specimen were inspected using an optical microscope or an electron microscope, and the resistance of the pattern-wise cured product to the plating solution, the shape of the formed bumps, and the resistance of the pattern-wise cured product to the plating process were evaluated using the following criteria.

A: The state of the formed bumps and the pattern-wise cured product revealed no particular changes, and the formed bumps and the pattern-wise cured product were favorable.

C: Cracking, swelling, or chipping occurred in the pattern-wise cured product, or the surface of the pattern-wise cured product appeared very rough.

Bump Shape

A treated test specimen was prepared in the same manner as for the plating solution resistance evaluation, the state of the bumps and the pattern-wise cured product formed on the surface of the treated test specimen were inspected using an optical microscope or an electron microscope, and the shape of the formed bumps was evaluated using the following criteria. Furthermore, in those cases where the bump shape was favorable, the angle between the substrate and the bumps, and the error ratio relative to the mask dimensions were also measured.

A: The shapes of the bumps were favorable, and displayed good dependence on (good tracking of) the pattern-wise cured product.

C: The shapes of the bumps appeared swollen, and were independent of the pattern-wise cured product.

Releasability

The substrates comprising the pattern-wise cured product prepared for the evaluation of developability and resolution were used as test specimens. Each test specimen was immersed for 10 minutes in a stirred stripping solution at 70° C. (Stripper 104, manufactured by Tokyo Ohka Kogyo Co., Ltd.), was subsequently rinsed with alcohol to remove the pattern-wise cured product, and was then inspected, either visually or under an optical microscope, and evaluated using the following criteria.

A: No residues of the pattern-wise cured product were visible.

C: Residues of the pattern-wise cured product were visible.
Photosensitivity

Coating films of each of the various film thickness values were formed on 5-inch silicon wafers, and each coating film was exposed with ultraviolet radiation in sections, through a pattern mask used for measuring resolution, at exposure doses ranging from 100 to 10,000 mJ/cm², using a stepper device (NSR-2005i10D, manufactured by Nikon Corporation). The exposed coating film was then developed in a developing solution (brand name: P-7G from the PMER series, manufactured by Tokyo Ohka Kogyo Co., Ltd.). The developed product was washed under running water, and blown with nitrogen to yield a pattern-wise cured product. This cured product was inspected under a microscope, and the minimum exposure dose required to form a pattern with an aspect ratio of 2 or greater, with no visible residues, in other words, the minimum dose required to form a pattern, was measured.

Each of the above evaluations was performed for each positive photoresist composition prepared in the examples 1 to 13, and the comparative example 1. The results are shown in Table 2.

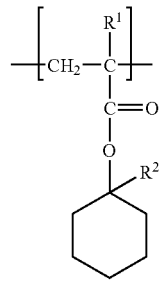

(wherein, $R^1$ represents a hydrogen atom or a methyl group, and $R^2$ represents a lower alkyl group), and the polymerizable compound containing an ether linkage is a compound represented by a general formula (7) shown below, or phenoxypolyethylene glycol (meth)acrylate, methoxypolypropylene glycol (meth)acrylate, or tetrahydrofurfuryl (meth)acrylate:

$$CH_2=C(R')COO-(C_mH_{2m}-CHR^{10}-O)_n-R'' \qquad (7)$$

TABLE 2

| | Example | | | | | | | | | | | | | | | Comparative example |
|---|---|---|---|---|---|---|---|---|---|---|---|---|---|---|---|---|
| | 1 | 2 | 3 | 4 | 5 | 6 | 7 | 8 | 9 | 10 | 10 | 10 | 11 | 12 | 13 | 1 |
| Compatibility | A | A | A | A | A | A | A | A | A | A | A | A | A | A | A | A |
| Coatability | B | A | A | A | A | A | A | A | A | A | A | B | A | A | A | B |
| Film thickness | 20 | 20 | 20 | 20 | 20 | 20 | 20 | 20 | 20 | 20 | 65 | 120 | 20 | 20 | 20 | 20 |
| Developability | A | A | A | A | A | A | A | A | A | A | A | A | A | A | A | A |
| Plating solution resistance | A | A | A | A | A | A | A | A | A | A | A | A | A | A | A | C |
| Bump shape | A | A | A | A | A | A | A | A | A | A | A | A | A | A | A | C |
| Releasability | A | A | A | A | A | A | A | A | A | A | A | A | A | A | A | |
| Photosensitivity | 300 | 300 | 300 | 300 | 300 | 300 | 500 | 500 | 500 | 500 | 2000 | 5000 | 500 | 300 | 500 | 1000 |

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A chemically amplified positive photoresist composition for thick film that is used for forming a thick-film photoresist layer with a film thickness of 10 to 150 μm on top of a support, comprising:
   (A) a compound that generates acid on irradiation with active light or radiation; and
   (B) a resin that displays increased alkali solubility under action of acid;
   wherein said component (B) comprises a resin formed from a copolymer containing a structural unit (b1), and a structural unit (b2) derived from a polymerizable compound containing an ether linkage, the structural unit (b1) represented by a general formula (1) shown below:

(wherein, R' represents a hydrogen atom or a methyl group, $R^{10}$ represents a hydrogen atom or an alkyl group of 1 or 2 carbon atoms, R" represents an alkyl group or aryl group of 2 to 7 carbon atoms that may also contain an oxygen atom, m represents an integer of either 1 or 2, and n represents an integer from 1 to 10).

2. A chemically amplified positive photoresist composition for thick film according to claim 1, wherein in said general formula (1), $R^2$ is an alkyl group of 2 to 4 carbon atoms.

3. A chemically amplified positive photoresist composition for thick film according to claim 1, wherein relative to 100 parts by weight of said component (B), a quantity of said component (A) is within a range from 0.1 to 10 parts by weight.

4. A chemically amplified positive photoresist composition for thick film according to claim 1, further comprising: an alkali-soluble resin (C).

5. A chemically amplified positive photoresist composition for thick film according to claim 4, wherein said alkali-soluble resin (C) comprises at least one resin selected from the group consisting of (c1) novolak resins, (c2) copolymers containing a hydroxystyrene structural unit and a styrene structural unit, (c3) acrylic resins, and (c4) vinyl resins.

6. A chemically amplified positive photoresist composition for thick film according to claim 1, further comprising: an acid diffusion control agent (D).

7. A thick-film photoresist laminated product, comprising:
a support; and
a thick-film photoresist layer with a film thickness of 10 to 150 µm, formed from a chemically amplified positive photoresist composition for thick film according to claim 1, laminated on top of said support.

8. A manufacturing method for a thick-film resist pattern, comprising:
a lamination step for producing a thick-film photoresist laminated product according to claim 7;
an exposure step for selectively irradiating said thick-film photoresist laminated product with active light or radiation; and
a developing step for conducting post exposure developing to produce a thick-film resist pattern.

9. A manufacturing method for a connection terminal, comprising:
a step for forming a connection terminal comprising a conductor on a resist-free portion of a thick-film resist pattern produced using a manufacturing method for a thick-film resist pattern according to claim 8.

10. A manufacturing method for a connection terminal according to claim 9, wherein a depth of said resist-free portion is within a range from 10 to 150 µm.

11. A thick-film photoresist laminated product, comprising:
a support; and
a thick-film photoresist layer with a film thickness of 20 to 120 µm, formed from a chemically amplified positive photoresist composition for thick film according to claim 1, laminated on top of said support.

* * * * *